(12) United States Patent
Ernst

(10) Patent No.: US 7,928,672 B2
(45) Date of Patent: Apr. 19, 2011

(54) MODULATOR FOR CIRCULAR INDUCTION ACCELERATOR

(75) Inventor: Vincent Ernst, Pennington, NJ (US)

(73) Assignee: Schlumberger Technology Corporation, Cambridge, MA (US)

( * ) Notice: Subject to any disclaimer, the term of this patent is extended or adjusted under 35 U.S.C. 154(b) by 473 days.

(21) Appl. No.: 11/857,908

(22) Filed: Sep. 19, 2007

(65) Prior Publication Data

US 2009/0072767 A1    Mar. 19, 2009

(51) Int. Cl.
    *H05H 11/00*    (2006.01)
(52) U.S. Cl. ................ 315/504; 315/500; 323/222
(58) Field of Classification Search .......... 315/502, 315/504, 503, 500, 505, 506, 507; 323/222, 323/209
    See application file for complete search history.

(56) References Cited

U.S. PATENT DOCUMENTS

| | | | |
|---|---|---|---|
| 3,321,625 A | 5/1967 | Wahl | |
| 3,975,689 A | 8/1976 | Geizer et al. | |
| 3,996,473 A | 12/1976 | Culver | |
| 4,577,156 A | 3/1986 | Kerst | |
| 4,823,044 A | 4/1989 | Falce | |
| 5,077,530 A | 12/1991 | Chen | |
| 5,122,662 A | 6/1992 | Chen et al. | |
| 5,293,410 A | 3/1994 | Chen et al. | |
| 5,319,314 A | 6/1994 | Chen | |
| 5,426,409 A | 6/1995 | Johnson | |
| 5,525,797 A | 6/1996 | Moake | |
| 5,745,536 A | 4/1998 | Brainard et al. | |
| 5,804,820 A | 9/1998 | Evans et al. | |
| 5,912,460 A | 6/1999 | Stoller et al. | |
| 6,121,850 A | 9/2000 | Ghoshal | |
| 6,184,662 B1 * | 2/2001 | Yabuuchi et al. | 323/222 |
| 6,201,851 B1 | 3/2001 | Piestrup et al. | |
| 6,441,569 B1 | 8/2002 | Janzow | |
| 6,713,976 B1 | 3/2004 | Zumoto et al. | |
| 6,925,137 B1 | 8/2005 | Forman | |
| 7,148,613 B2 | 12/2006 | Dally et al. | |
| 2006/0261759 A1 | 11/2006 | Chen et al. | |

OTHER PUBLICATIONS

Ellis et al., Well Logging for Earth Scientists, Springer, 2nd edition, 2007, pp. 345-379.

* cited by examiner

*Primary Examiner* — David Hung Vu
(74) *Attorney, Agent, or Firm* — James McAleenan; Vincent Loccisano; Brigid Laffey

(57) ABSTRACT

Described herein is a modulator circuit for generating discrete energy pulses in a device. The circuit includes a high voltage power source intermittently coupled to a saturable first inductor, a second inductor and a capacitor coupled in parallel between the high voltage power source and the saturable first inductor and second inductor. When the first inductor is unsaturated, its inductance is high and it isolates the capacitor from the second inductor. When the first inductor saturates, the inductance collapses and the capacitor discharges a high energy pulse into the second coil. By controlling the time to saturation, the timing of the pulses is controlled. The modulator circuit is effective to control pulses applied to a circular induction accelerator, such as a Betatron.

15 Claims, 5 Drawing Sheets

FIG. 5

$K_w := 0.23$  $\Lambda := 0.085$  $CoreMass := 0.3 \cdot \dfrac{lb}{in^3}$  $OD := 2.75\ in$ $Bm := 15000$ $MagneticFillFactor := 0.65$  $Aw := 0.0912 \cdot cm^2$ $$WaAc := \dfrac{Aw \cdot \Lambda\, 10^8}{2 \cdot Bm \cdot K} \cdot cm^2$$

$$Wa\,(ID) := \pi \left(\dfrac{ID}{2}\right)^2 \cdot in^2$$

$$Ac\,(ID) := \dfrac{WaAc}{Wa\,(ID)} \cdot in^2$$

$$Turns\,(ID) := Round\left(\dfrac{\Lambda \cdot 10^8 \cdot cm^2}{2 \cdot Bm \cdot Ac\,(ID)} + 0.5,\, 1\right)$$

$$Height\,(OD, ID) := Round\left[\dfrac{Ac\,(ID)}{MagneticFillFactor \left(\dfrac{OD - ID}{2}\right)} + 0.125 \cdot in,\, 0.25 \cdot in\right]$$

$$CoreVol\,(OD, ID) := \dfrac{\pi}{4} \cdot (OD + ID)(OD - ID) \cdot Height\,(OD, ID) \cdot MagneticFillFactor$$

$CoreWeight\,(OD, ID) := CoreVol\,(OD, ID) \cdot CoreMass$ $Pcopperloss\,(OD, ID) := 10.147 \cdot Turns\,(ID) \cdot (OD - ID + 2 \cdot Height\,(OD, ID)) \cdot \dfrac{W}{m}$ $Pcoreloss\,(OD, ID) := CoreWeight\,(OD, ID) \cdot 12\, \dfrac{W}{lb}$ $Ploss\,(OD, ID) := Pcopperloss\,(OD, ID) + Pcoreloss\,(OD, ID)$ $Loss\,(OD, ID) := \dfrac{Ploss\,(OD \cdot in, ID \cdot in)}{W}$ $Ploss\,(OD, 1.5 \cdot in) = 108.191\ W$ $Turns\,(1.5 \cdot in) = 29$ $Height\,(OD, 1.5 \cdot in) = 4\ in$ $CoreVol\,(OD, 1.5 \cdot in) = 10.848\ in^3$ $CoreWeight\,(OD, 1.5 \cdot in) = 3.254\ lb$

MODULATOR FOR CIRCULAR INDUCTION ACCELERATOR

BACKGROUND

1. Field

This disclosure relates to an oscillating modulator circuit useful to generate energy pulses in a circular induction accelerator, such as a Betatron.

2. Description of the Related Art

Circular induction accelerators, such as Betatrons, are magnetic devices used to accelerate electrons to relativistic energies. A high energy electron beam is extracted and directed on a suitable target, generating high energy x-rays. One application of the high energy x-rays is for logging oilfield boreholes, such as to map subsurface density and lithology.

Effective operation of a Betatron requires high, pulsed, currents and voltages to generate the magnetic field necessary for acceleration and confinement of the electrons. The Betatron device is controlled and run by several power supplies, which form the Betatron modulator. A conventional Betatron driving circuit utilizes a high voltage D.C. power supply, coupled to a pulse generating modulator circuit, which in turn drives the Betatron coils. Recapturing the pulse energy for use in subsequent pulses requires a complicated switching network and large capacitor. For example, U.S. Pat. No. 3,975,689 illustrates a network of four switches to reverse the direction of current flow from a charged capacitor to the Betatron coils. The switches tend to be lossy (power losing/heat generating) and therefore require a substantial power source to replace lost power into the system and are difficult to cool. If the temperature of the circuit components increases too much, silicon-base circuit components may fail. The circuitry may be exposed to a temperature increase due to both internal resistance and environmental exposure. The temperature at the bottom of a borehole may be 250° C. hotter than at the surface.

U.S. Pat. No. 5,077,530 to Chen discloses a Betatron driving circuit having a combination of a low voltage D.C. power supply and a high voltage excitation capacitor to drive the Betatron. Diodes and switches control pulse polarity and conduct all the current, so lossy components remain a concern. U.S. Pat. No. 5,077,530 is incorporated by reference herein in its entirety.

There remains a need for a modulator for circular induction accelerators that addresses the limitations described above and remains functional in a downhole environment.

BRIEF SUMMARY

The details of one or more embodiments of the invention are set forth in the accompanying drawings and the description below. Other features, objects and advantages of the invention will be apparent from the description and drawings, and from the claims.

Described herein is a modulator circuit for generating discrete energy pulses in a device. The circuit includes a high voltage power source intermittently coupled to a saturable first inductor, a second inductor that is a Betatron coil, and a capacitor. The capacitor is coupled in parallel between the high voltage power source and both of the saturable first inductor and Betatron coil. When the first inductor is unsaturated, its inductance is high and it isolates the capacitor from the second inductor. When the first inductor saturates, the inductance collapses and the capacitor discharges a high energy pulse into the Betatron coil. By controlling the time to saturation, or by any other effective method, the timing of the pulses is controlled.

BRIEF DESCRIPTION OF THE DRAWINGS

FIG. 5 is a table illustrating a calculation of other requirements for the exemplary saturable reactor of FIG. 3.

Like reference numbers and designations in the various drawings indicated like elements.

DETAILED DESCRIPTION

Figure 1:
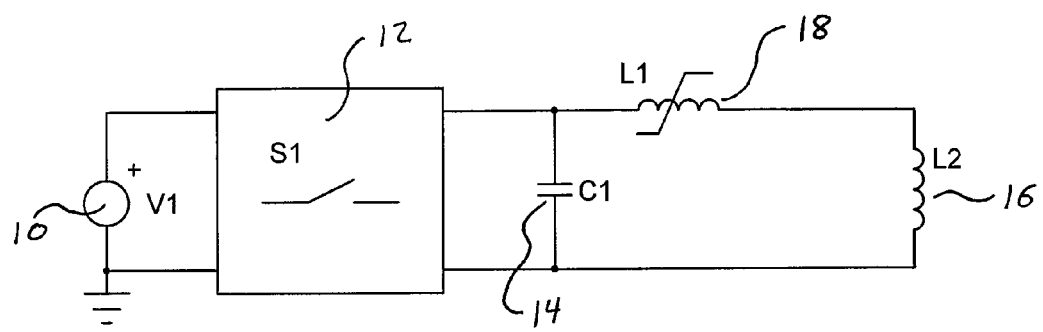
FIG. 1 illustrates a modulator circuit effective to drive a circular induction accelerator.

FIG. 1 illustrates a modulator circuit that includes a high voltage power supply 10, a switching configuration 12 effective to disconnect the power supply 10 from the circuit and, optionally, to reverse polarity, an energy storage capacitor 14, a coil 16 that is a portion of a circular linear accelerator, and a saturable reactor 18. The circuit functions as a relaxation oscillator and is capable of generating both positive and negative current pulses to drive coil 16.

The coil 16 may be replaced with a different type of load. When the load is a Betatron, both positive and negative cycles may be used to generate radiation. The capacitor 14 may be used to control the shape of the pulse. Alternatively, other pulse shaping elements, such as a pulse forming network (PFN), may be inserted into the circuit.

When the saturable reactor 18 is in an unsaturated state, its inductance is high, on the order of 100 times the inductance of the Betatron coil 16, essentially isolating capacitor 14 from coil 16. Controlled by the volt-second product, saturable reactor 18 will hold off the voltage on capacitor 14 for a certain period of time, until the saturable reactor 18 saturates at which point the inductance collapses, thereby discharging capacitor 14 into coil 16. The saturable reactor 18 will return to the unsaturated state the moment the current in the system returns to 0. At this point, the voltage on the capacitor 14 is recharged. The recharged voltage is equal in amplitude, if losses are ignored, but opposite in polarity. To compensate for losses, the capacitor 14 is also replenished from power supply 10 as described below. The saturable reactor 18 will hold off the voltage again until it saturates, at which time capacitor 14 discharges again, but now generates a current pulse of opposite polarity. Optionally this portion of the cycle may be used to inject electrons into the betatron coil 16 in an opposing direction.

Figure 2:
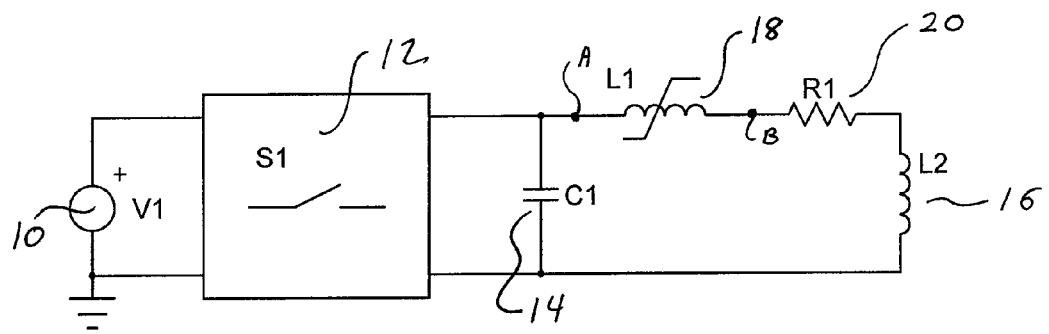
FIG. 2 illustrates the modulator circuit of FIG. 1 including resistance caused by circuit components.

FIG. 2 represents losses in the circuit by resistance 20. Sources of the losses include capacitor 14 ESR (Equivalent Series Resistance) losses and saturable inductor 18 and coil 16 magnetic and copper losses. For proper operation, the oscillating circuit is underdamped. As recited in Equations (2) and (9) below, this requires the resistance 20 to be less than $$R_1 < 2\sqrt{\frac{L_s}{C_1}}.$$

Due to the losses, a fraction of the original energy is lost as heat and is replenished by power supply 10. The polarity of power supply 10 is switched to conform with the polarity of the voltage on capacitor 14. Switching may be accomplished with an H-bridge type circuit, or equivalent, incorporated into switch 12. If polarity switching is not required for a given application, an on/off switch may be employed. The switching configuration may be a MOSFET, IGBT, relay or any other suitable switching device.

Figure 3:
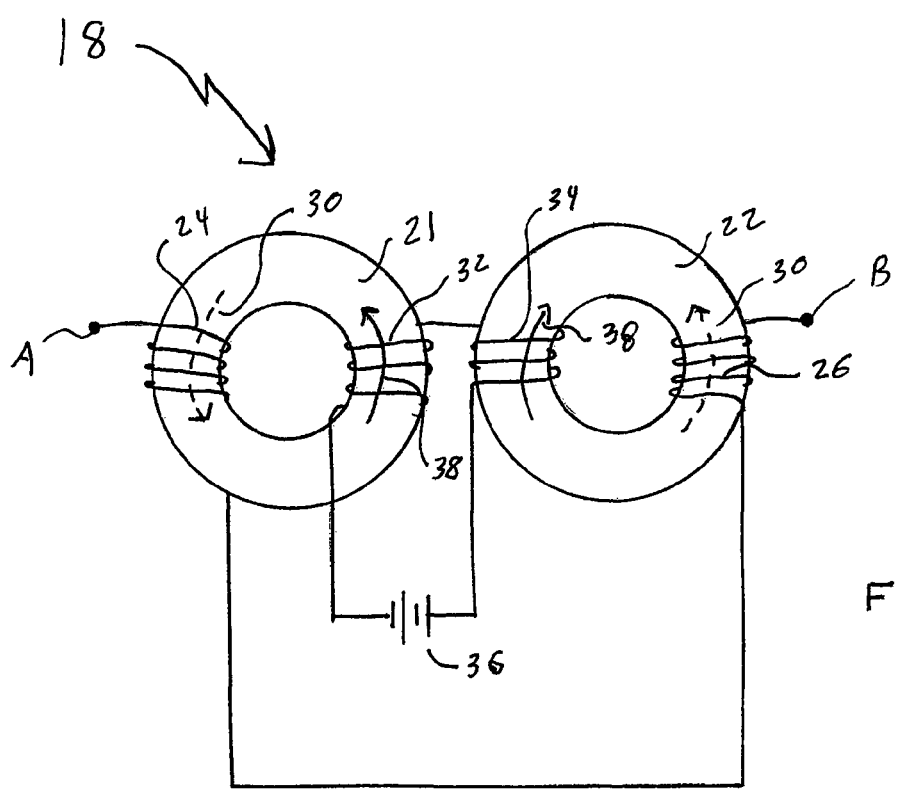
FIG. 3 illustrates a variable saturable inductor used as a saturable reactor in accordance with an embodiment disclosed herein.

If more precise control of timing is required, a control winding may be added to the saturable reactor 18. An exemplary saturable reactor is illustrated in FIG. 3. The exemplary variable inductor 18 includes a first core 21 and second core 22 both formed from a highly permeable material. A first signal winding 24 around first core 21 and a second signal winding 26 around a second core 22 are connected inducing a signal flux 30. A first control winding 32 around the first core 21 and a second control winding 34 around the second core 22 are connected to a DC power source 36 inducing a control flux 38 that is used to influence the time to saturation. Connection points A and B align with connection points A and B in FIG. 2 to illustrate how the variable inductor 18 may be fit into the modulator circuit.

Figure 4:
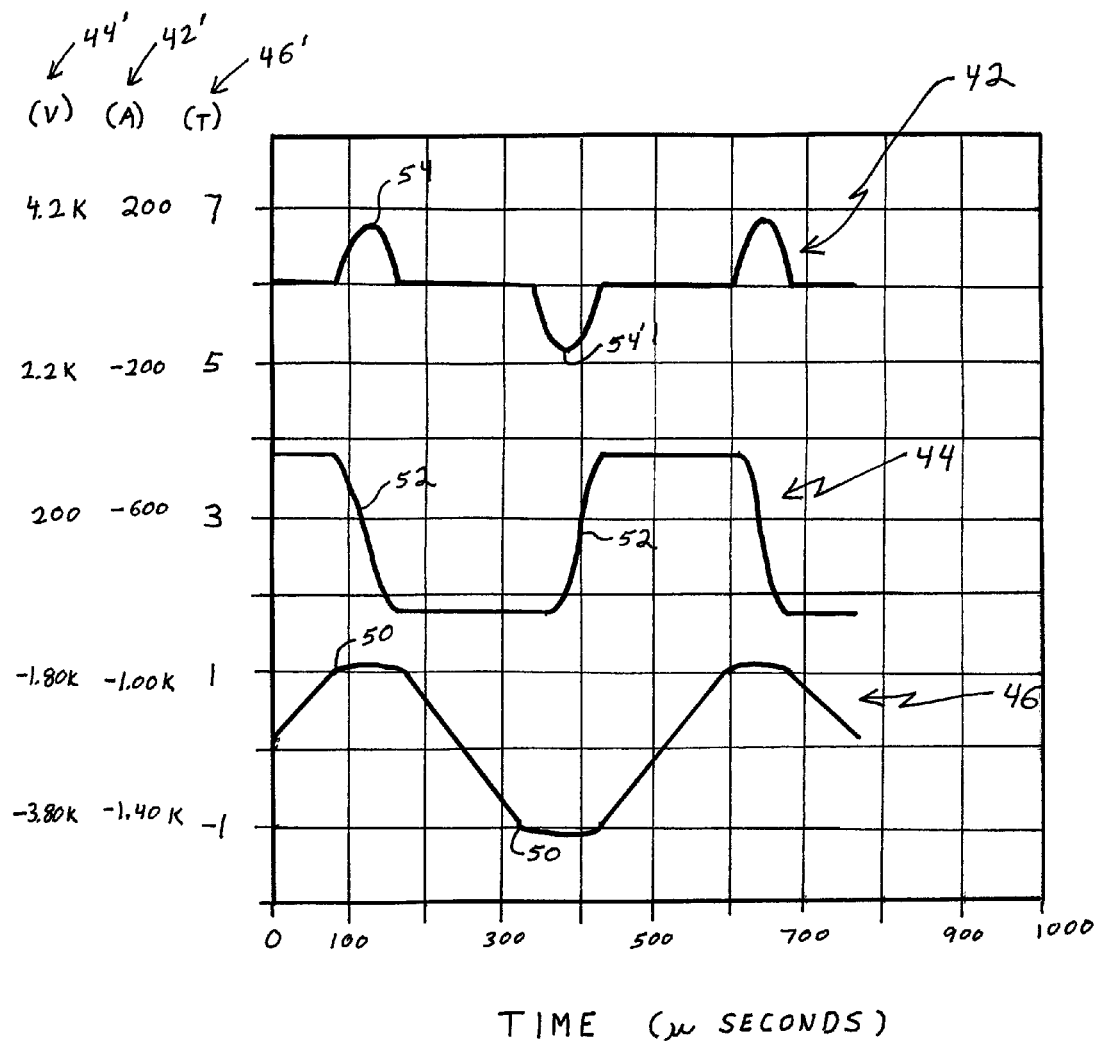
FIG. 4 graphically illustrates current, voltage and magnetic flux density as functions of time for the circuit of FIG. 2.

FIG. 4 graphically depicts a cycle for the circuit described above. Current trace 42 is the current through the Betatron coil, voltage trace 44 is the voltage on the capacitor, and magnetic flux density trace 46 is the magnetic flux density in the saturable reactor. The horizontal axis presents a common time scale in microseconds. The vertical axis presents a current trace scale 42' in amperes (A), a voltage trace 44' scale in volts (V), and a magnetic flux density scale 46' in tesla (T). When the saturable reactor saturates 50, its blocking effect on the circuit collapses and the capacitor discharges 52 generating a current pulse 54 in the Betatron coil.

Referring back to FIG. 2, when the circuit is in a saturated mode, switch 12 isolates the power supply 10 from the circuit prior to the saturable reactor 18 saturating. At saturation, the circuit is reduced to an underdamped RLC network with the capacitor 14 having an initial voltage $V_1$ and an initial current $I_0$. The governing equation for this system is:

$$I(t) = \frac{2V_1 - I_0 R_1}{2\omega_s L_s} e^{-\frac{R_1}{2L_s}t} \sin(\omega_s t) + I_0 e^{-\frac{R_1}{2L_s}t} \cos(\omega_s t) \qquad (1)$$

Where: $L_s = L_{1_{SAT}} + L_2$ $L_{1_{SAT}}$ is the saturated inductance of $L_1$ $I_0$ is the current at time 0

$$\omega_s = \sqrt{\frac{1}{L_s C_1} - \left(\frac{R_1}{2L_s}\right)^2}$$

$V_1$ is the voltage at time 0.

For the system to be underdamped, the losses should be less than:

$$R_1 < 2\sqrt{\frac{L_s}{C_1}} \qquad (2)$$

The length of the current pulse is derived by setting the derivative of (1) to 0 (which gives the location of the maximum), and taking twice this length. At this point, I(t) will have returned to $I_0$. This leads to:

$$\tau_{spulse} = \frac{2}{\omega_s} \arctan\left(\frac{4V_1 \omega_s L_s}{2V_1 R_1 + I_0 (4\omega_s^2 L_s^2 - R_1^2)}\right) \qquad (3)$$

Which can be approximated by:

$$\tau_{spulse} \approx \frac{\pi}{\omega_s} \qquad (4)$$

The peak current is given by:

$$I_{PEAK} = \frac{V_1}{L_s \omega_s} e^{-\frac{R_1 \pi}{4L_s \omega_s}} \qquad (5)$$

At the end of the current pulse, the amplitude of the voltage on capacitor 14 is given by:

$$V_{C_1} = -\frac{V_1}{C_1 L_s \omega_s^2} e^{-\frac{R_1 \pi}{2L_s \omega_s}} \qquad (6)$$

The time that L1 can hold off the voltage on 14 is given by:

$$\tau_{holdoff} = \frac{\Lambda}{V_1} \qquad (7)$$

where $\Lambda$ is the voltage-time holdoff of the core

The oscillation frequency is given by:

$$\frac{1}{f_{osc}} = 4\tau_{holdoff} + 2\tau_{spulse} \qquad (8)$$

Now we can approximate the loss in Watts to be:

$$P_{loss} = C_1 V_1^2 f_{osc} \left(1 - e^{-\frac{R_1 \pi}{L_s \omega_s}}\right) \qquad (9)$$

When operating in the unsaturated mode, it is necessary to recharge capacitor 14, so switch 12 is engaged to couple the power supply 10 to the circuit with the correct polarity. $L_{1\ UNSAT}$ is much greater, by a factor on the order of 100 times, than $L_{1\ SAT}$ so that equation (2) is true and the system is again underdamped and the response is equivalent to a step response of an underdamped RLC network.

$$I(t) = \frac{2V_1 - I_0 R_1}{2\omega_u L_u} e^{-\frac{R_1}{2L_u} t} \sin(\omega_u t) + I_0 e^{-\frac{R_1}{2L_u} t} \cos(\omega_u t) \quad (10)$$

Where $L_u = L_{1_{UNSAT}} + L_2$;
$L_{1_{UNSAT}}$ is the unsaturated inductance of $L_1$;
$I_0$ is the current at time $0$; and $$\omega_u = \sqrt{\frac{1}{L_u C_1} - \left(\frac{R_1}{2L_u}\right)^2}$$

We can solve for the length of this pulse by setting this current to 0, which will be half of the pulse. Since we are unsaturated, this will also be equal to the voltage holdoff.

$$\tau_{upulse} = 2\frac{\Lambda}{V_1} = 2\frac{1}{\omega_u} \arctan\left(\frac{2I_0 \omega_u L_u}{2V_1 - I_0 R_1}\right) \quad (11)$$

Rewriting gives the expression for $I_0$:

$$I_0 = \frac{2V_1 \tan\left(\frac{\Lambda \omega_u}{V_1}\right)}{2\omega_u L_u - R_1 \tan\left(\frac{\Lambda \omega_u}{V_1}\right)} \quad (12)$$

If the argument of the tangent is small enough, we can approximate the tangent with its Taylor expansion, and rewrite expression (12):

$$I_0 \approx \frac{2\Lambda}{2L_u - R_1 \frac{\Lambda}{V_1}} \quad (13)$$

Which in turn can be approximated by:

$$I_0 \approx \frac{\Lambda}{L_u} \quad (14)$$

This leads to the conclusion that, for a required maximum $I_0$, we can derive a required minimum $L_{1_{UNSAT}}$ which directly translates into a required core permeability. For the exemplary values of $I_0$ less than 5 amps and $\Lambda$ equal to 0.085, $L_{1_{UNSAT}}$ is greater than 17 mH.

For borehole logging, exemplary frequencies of the current pulse are between 4 kHz and 8 kHz and preferably about 6 kHz, or $\tau_{spulse}$=84 µs. We want the main oscillating $f_{OSC}$ to be between 1.5 kHz and 2.5 khz and nominally about 2 kHz, and therefore $\tau_{holdoff}$=85 µs.

Assuming that $L_{1_{SAT}}$=10 µH, so that $L_S$=144 µH and $L_2$ is 134 µH. For the desired $\tau_{spulse}$=84 µs we can compute that $C_1 \approx 5$ µF. The losses should be less than about 10Ω for an underdamped system.

For a peak current $I_{PEAK}$=175 A, and an estimated loss $R_1$=0.15Ω we can use equation (5) to calculate $V_1 \approx 950V$. In order to give us some headroom we will use $V_1$=1000V, which leads to $\Lambda$=0.085 Vs.

Figure 6:
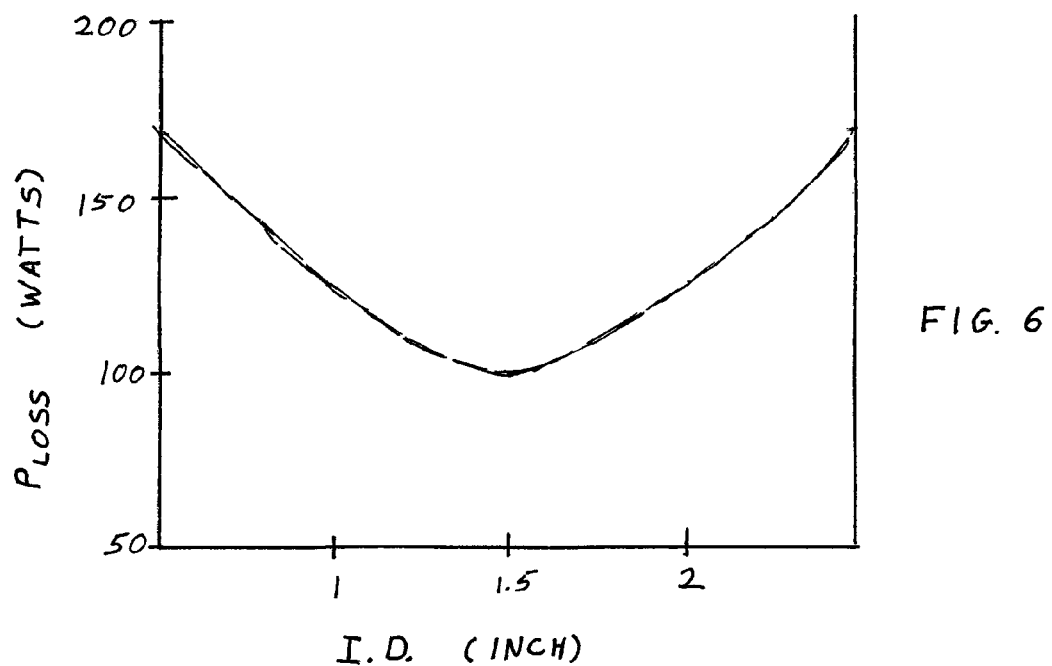
FIG. 6 graphically illustrates the total power loss of the saturable inductor of FIG. 3 as a function of core internal diameter.

FIG. 5 shows a MathCad spreadsheet that was used to calculate the core parameters. FIG. 6 shows the total power loss as a function of the core ID (core OD is 2.75 inch). An exemplary core ID is 1.5 inch, which leads to a core height of 4 inch, 29 turns of AWG8 wire and about 110 W loss.

Figure 7:
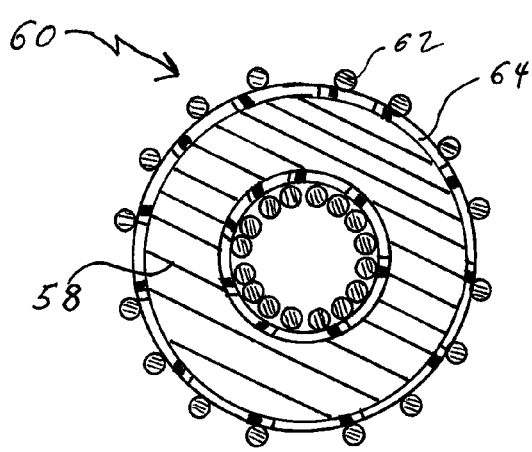
FIG. 7 illustrates the core of saturable inductor of FIG. 3 in cross-sectional representation.

FIG. 7 shows a core 60 of the exemplary saturable inductor in cross sectional representation. An exemplary saturable material 58 is a, by weight, 50% nickel/50% iron compound such as Orthonol. Orthonal is a registered trademark of Spang & Company, Butler, Pa. Wire windings 62 extend around the outside diameter and inside diameter of the saturable material 58 with an insulating layer 64 electrically isolating the wire windings from the saturable material.

In order to calculate the inductance of the designed core, we first need to know the magnetic path length. The magnetic path length can be approximated by:

$$l_e \approx \frac{\pi(OD - ID)}{\ln\left(\frac{OD}{ID}\right)} \quad (15)$$

This leads to a magnetic path length of about 16.5 cm. The inductance is given by:

$$L_{unsat,sat} = \frac{.4\pi \mu_{unsat,sat} N^2 A_c}{10^8 l_e} \quad (16)$$

In the exemplary configuration:

$$L_{unsat,sat} = \frac{.4\pi \cdot 29^2 \cdot 10.484}{10^8 \cdot 16.5} \mu_{unsat,sat} = 6.7 \cdot 10^{-6} \mu_{unsat,sat} \quad (17)$$

As described herein, and with reference to FIG. 2, an exemplary circuit has components with the following values:

| | |
|---|---|
| Power supply 10: | 1000 volts/1 amp |
| Switch 12: | H-Bridge, MOSFET, or other as described above |
| Capacitor 14: | 5 µF at 1000 volts |
| Coil 16: | Betatron, 134 µH |
| Saturable inductor 18: | Saturated inductance about 10 µH, unsaturated inductance in excess of 17 mH |
| Resistance 20: | Preferably less than 10 Ω |

Among the advantages of the circuit described hereinabove are that there are no lossy diodes and solid state switches in the high current path; there is no need for a large tank capacitor; and since the circuit is self-oscillating a control circuit is optional. By appropriate selection of magnetic materials, wire size and capacitor material, the losses can be kept to a minimum; the reliability of the circuit is extremely high; and the circuit is suitable for operation at very high temperatures.

One or more embodiments of the present invention have been described. Nevertheless, it will be understood that various modifications may be made without departing from the spirit and scope of the invention. Accordingly, other embodiments are within the scope of the following claims.

What is claimed is:

1. A modulator circuit for generating discrete energy pulses in a device, the modulator circuit comprising:
   a high voltage power source intermittently coupled to a saturable first inductor and a second inductor; and
   a capacitor coupled in parallel between said high voltage power source and said saturable first inductor and said second inductor, wherein said saturable first inductor, said second inductor and said capacitor have a total resistance sufficiently low that the modulator circuit is underdamped.

2. The modulator circuit of claim 1 wherein a switch disposed between said high voltage power supply and said saturable first inductor, said second inductor and said capacitor is effective to both couple and decouple said high voltage power supply and regulate a polarity of power provided from said high voltage power supply.

3. The modulator circuit of claim 2 wherein the polarity of said energy pulses alternates each pulse.

4. The modulator circuit of claim 2 wherein said saturable first inductor includes a control winding effective to contribute a control flux and thereby adjust time to saturation.

5. The modulator circuit of claim 3 wherein said device is a circular induction accelerator.

6. The modulator circuit of claim 5 wherein said device is a Betatron.

7. A method for generating a pulsed high current, comprising:
coupling a modulator circuit to a circular induction accelerator wherein said modulator circuit includes a high voltage power source intermittently coupled to a saturable first inductor and a capacitor coupled in parallel between said high voltage power source and said saturable first inductor with said circular induction accelerator being electrically connected to said saturable first inductor and said capacitor;
charging said capacitor at first polarity for a first interval of time that does not exceed a time required to saturate said first inductor; and
after said first interval of time, discharging said capacitor into said circular induction accelerator and recharging said capacitor at a reversed polarity.

8. The method of claim 7 including replenishing said capacitor at said reverse polarity for a second time interval and then discharging said capacitor into said circular induction accelerator and then recharging said capacitor at said first polarity.

9. The method of claim 8 including disposing a switch between said power supply and said saturable first inductor, capacitor and circular induction accelerator, said switch effective to selectively couple and decouple said power supply from said saturable first inductor, capacitor and circular induction accelerator.

10. The method of claim 9 including selecting said switch to be effective to alternate the polarity of energy pulses delivered by said power supply when replenishing said capacitor.

11. The method of claim 10 wherein said saturable first inductor, capacitor and circular induction accelerator are selected such that their total resistance $R_1$ satisfies the equation $$R_1 < 2\sqrt{\frac{L_s}{C_1}}$$

leading to an underdamped oscillating circuit.

12. The method of claim 11 wherein said saturable first inductor has a controllable inductance.

13. The method of claim 12 wherein a control winding around said saturable first inductor introduces a control flux to selectively adjust said time to saturation.

14. The method of claim 9 wherein said circular induction accelerator is selected to be a Betatron.

15. The method of claim 14 wherein said modulator circuit oscillates at a frequency of from 1.5 kHz to 2.5 kHz.

* * * * *